United States Patent
Wu et al.

(10) Patent No.: US 10,955,484 B2
(45) Date of Patent: Mar. 23, 2021

(54) BATTERY STATE MONITORING METHOD AND APPARATUS

(71) Applicant: NINGDE AMPEREX TECHNOLOGY LIMITED, Ningde (CN)

(72) Inventors: Fei Wu, Ningde (CN); Juan Jin, Ningde (CN); Kefei Wang, Ningde (CN)

(73) Assignee: NINGDE AMPEREX TECHNOLOGY LIMITED, Ningde (CN)

( * ) Notice: Subject to any disclaimer, the term of this patent is extended or adjusted under 35 U.S.C. 154(b) by 80 days.

(21) Appl. No.: 16/214,746

(22) Filed: Dec. 10, 2018

(65) Prior Publication Data

US 2019/0178950 A1 Jun. 13, 2019

(30) Foreign Application Priority Data

Dec. 13, 2017 (CN) .......................... 201711332670.3

(51) Int. Cl.
*G01R 31/389* (2019.01)
*G01R 31/3842* (2019.01)
(Continued)

(52) U.S. Cl.
CPC ....... *G01R 31/389* (2019.01); *G01R 31/3842* (2019.01); *G01R 31/367* (2019.01); *G01R 31/392* (2019.01)

(58) Field of Classification Search
CPC .......................... G01R 31/389; G01R 31/3842; G01R 31/392; G01R 31/367
See application file for complete search history.

(56) References Cited

U.S. PATENT DOCUMENTS

| 2008/0204031 A1* | 8/2008 | Iwane .................. G01R 31/389 324/430 |
| 2009/0099802 A1* | 4/2009 | Barsoukov ......... G01R 31/3648 702/65 |

(Continued)

FOREIGN PATENT DOCUMENTS

| CN | 1572042 A | 1/2005 |
| CN | 201054018 Y | 4/2008 |

(Continued)

OTHER PUBLICATIONS

Chinese First Office Action dated Oct. 16, 2020 in Chinese counterpart application 201711332670.3, 10 pages in Chinese.

(Continued)

*Primary Examiner* — Akm Zakaria
(74) *Attorney, Agent, or Firm* — Juan Carlos A. Marquez; Marquez IP Law Office, PLLC

(57) ABSTRACT

The present disclosure relates to the field of battery state monitoring technologies, and in particular, to a battery state monitoring method and apparatus. The method is: monitoring a voltage value and a current value of an output end of a battery; determining a battery impedance value based on the voltage value; calculating an impedance voltage-drop value based on the current value and the battery impedance value; calculating an open circuit voltage of the battery based on the voltage value and the impedance voltage-drop value; when a difference of the open circuit voltage between (Continued)

two consecutive calculations is greater than or equal to a threshold, judging that the battery state is abnormal; and when the difference of the open circuit voltage between two consecutive calculations is determined to be lower than the threshold, updating the battery impedance value based on the voltage value and the current value. By using the foregoing method, the battery state is judged by verifying a relationship between a set threshold and a difference of the open circuit voltage between two consecutive calculations, thereby improving the accuracy of battery safety judgment. A possibility of a safety accident occurring in a battery can be predicted, thereby reducing or avoiding a risk of fire outbreak of a device caused due to a battery safety fault of the device.

11 Claims, 3 Drawing Sheets

(51) Int. Cl.
*G01R 31/367* (2019.01)
*G01R 31/392* (2019.01)

(56) References Cited

U.S. PATENT DOCUMENTS

| | | | |
|---|---|---|---|
| 2013/0030596 A1* | 1/2013 | Okada | G01R 31/389 700/297 |
| 2014/0025324 A1* | 1/2014 | Dang | G01R 31/3842 702/63 |

FOREIGN PATENT DOCUMENTS

| | | |
|---|---|---|
| CN | 101765940 A | 6/2010 |
| CN | 102246385 A | 11/2011 |
| CN | 203117396 U | 8/2013 |
| CN | 103403941 A | 11/2013 |
| CN | 105870525 A | 8/2016 |
| CN | 106062579 A | 10/2016 |
| CN | 106154172 A | 11/2016 |
| JP | 2003123850 A | 4/2003 |

OTHER PUBLICATIONS

"Internal short circuit detection for battery pack using equivalent parameter and consistency method," Ouyang et al., Journal of Power Sources, 294 (2015) pp. 272-283.

* cited by examiner

BATTERY STATE MONITORING METHOD AND APPARATUS

CROSS REFERENCE TO RELATED APPLICATIONS

The present application claims the benefit of priority from the China Patent Application No. 201711332670.3, filed on 13 Dec. 2017, the disclosure of which is hereby incorporated by reference in its entirety.

BACKGROUND

1. Field of the Invention

The present disclosure relates to the field of battery state monitoring technologies, and in particular, to a battery state monitoring method and apparatus.

2. Description of the Related Art

Lithium-ion batteries are an innovative green chemical power source, and have advantages such as a high voltage, a long service life, a large capacity and energy density, a small volume, and a low self-discharge rate compared with conventional nickel-cadmium batteries and nickel-metal hydride batteries. Currently, the lithium-ion batteries are widely applied because the lithium-ion batteries are characterized by having a high energy density, having a long service life, having no memory effect, and being environmentally friendly, and the like during application, and have been widely applied to various portable electronic devices.

However, because of the characteristics of the lithium-ion battery, when the lithium-ion battery is at an excessively low or excessively high temperature, is violently collided, is burned, is overcharged or over-discharged, or the like, the lithium-ion battery bursts into flames quite easily because of being short-circuited, and safety of the lithium-ion battery is far lower than that of another battery system such as a nickel-cadmium battery, a nickel-metal hydride battery, or a lead-acid battery. A safety accident of the lithium-ion battery is mainly caused by thermal runaway of the battery caused by being short-circuited in the battery. Because of occurrence of the safety accident of the lithium-ion battery, the industry again focuses on a safety problem of the lithium-ion battery. Moreover, because of the characteristics of the lithium-ion battery, it is quite difficult to radically resolve the safety problem of the lithium-ion battery.

Currently, a method for judging the safety of the lithium-ion battery is mainly: measuring released heat of the lithium-ion battery in an operating process, and then monitoring a temperature of the lithium-ion battery when thermal runaway occurs in the operating process, thereby evaluating safety of the lithium-ion battery. Such a judgment manner is a subjective judgment, and a monitoring result is affected by a plurality of environmental factors. As a result, the result of the judgment is not accurate.

SUMMARY

An objective of embodiments of the present disclosure is to provide a battery state monitoring method and apparatus, to resolve a problem existing in the prior art that a result of a battery safety judgment is not accurate, the battery state cannot be monitored in real time, and consequently fire outbreak of a device caused due to a battery safety accident of the device cannot be reduced or avoided.

Specific technical solutions provided in the embodiments of the present disclosure are as follows:

A battery state monitoring method includes:
monitoring a voltage value and a current value of an output end of a battery;
determining a battery impedance value based on the voltage value;
calculating an impedance voltage-drop value based on the current value and the battery impedance value;
calculating an open circuit voltage of the battery based on the voltage value and the impedance voltage-drop value;
when a difference of the open circuit voltage between two consecutive calculations is determined to be greater than or equal to a threshold, judging that the battery state is abnormal; and
when the difference of the open circuit voltage between two consecutive calculations is determined to be lower than the threshold, updating the battery impedance value based on the voltage value and the current value.

Preferably, the method further includes:
presetting a plurality of voltage nodes based on a minimum voltage value and a maximum voltage value of the output end of the battery, where the plurality of voltage nodes includes the minimum voltage value and the maximum voltage value; and obtaining at least one voltage range through partitioning between the minimum voltage value and maximum voltage value, where two neighboring voltage nodes form the at least one voltage range.

Preferably, the steps of determining a battery impedance value based on the voltage value, and calculating an impedance voltage-drop value based on the current value and the battery impedance value include:
determining a voltage range within which the voltage value falls, and using one voltage node of two neighboring voltage nodes with a smaller difference to the voltage value as a first voltage node corresponding to the voltage value; and
obtaining the battery impedance value corresponding to the first voltage node from a list that is of a correspondence between a voltage node and a battery impedance value updated in the last monitoring period, and using a product of the battery impedance value corresponding to the first voltage node and the current value of the output end of the battery as the impedance voltage-drop value.

Preferably, a manner of updating the list of a correspondence between a voltage node and a battery impedance value is:
within a monitoring period, when the voltage value of the output end of the battery is determined to be equal to any voltage node, monitoring the voltage value and the current value of the output end of the battery at a preset frequency;
dividing a difference of the voltage value between two consecutive calculations by a difference of the current value between two consecutive calculations, to obtain a real-time battery impedance value; and
continuously calculating the battery impedance values N times, and updating an average value of the battery impedance values to the battery impedance value that corresponds to the any voltage node and that is in the list of a correspondence between a voltage node and a battery impedance value.

Preferably, the step of calculating an open circuit voltage of the battery based on the voltage value and the impedance voltage-drop value includes:
using a sum of the voltage value and the impedance voltage-drop value as the open circuit voltage of the battery.

A battery state monitoring apparatus includes:

a monitoring unit, configured to monitor a voltage value and a current value of an output end of a battery;

a determining unit, configured to determine a corresponding battery impedance value based on the voltage value;

a first calculation unit, configured to calculate an impedance voltage-drop value based on the current value and the battery impedance value;

a second calculation unit, configured to calculate an open circuit voltage of the battery based on the voltage value and the impedance voltage-drop value; and a judgment unit, configured to judge that the battery state is abnormal when a difference of the open circuit voltage between two consecutive calculations is determined to be greater than or equal to a threshold.

Preferably, the apparatus further includes:

a setting unit, configured to preset a plurality of voltage nodes based on a minimum voltage value and a maximum voltage value of the output end of the battery, where the voltage nodes include the minimum voltage value and the maximum voltage value; and obtain at least one voltage range through partitioning between the minimum voltage value and maximum voltage value, where two neighboring voltage nodes form the at least one voltage range.

Preferably, when the corresponding battery impedance value is determined based on the voltage value, and the impedance voltage-drop value is calculated based on the current value and the battery impedance value:

the determining unit is specifically configured to: determine a voltage range within which the voltage value falls, and use one voltage node of two neighboring voltage nodes with a smaller difference to the voltage value as a first voltage node corresponding to the voltage value; and the first calculation unit is specifically configured to: obtain the battery impedance value corresponding to the first voltage node from a list that is of a correspondence between a voltage node and a battery impedance value updated in the last monitoring period, and use a product of the battery impedance value corresponding to the first voltage node and the current value of the output end of the battery as the impedance voltage-drop value.

Preferably, a manner of updating the list of a correspondence between a voltage node and a battery impedance value is:

within a monitoring period, when the voltage value of the output end of the battery is determined to be equal to any voltage node, monitoring the voltage value and the current value of the output end of the battery at a preset frequency;

dividing a difference of the voltage value between two consecutive calculation by a difference of the current value between the two consecutive calculations to obtain a real-time battery impedance value; and continuously calculating battery impedance values N times, and updating an average value of the battery impedance values to the battery impedance value that corresponds to the any voltage node and that is in the list of a correspondence between a voltage node and a battery impedance value.

Preferably, when the open circuit voltage of the battery is calculated based on the voltage value and the impedance voltage-drop value, the second calculation unit is specifically configured to:

use a sum of the voltage value and the impedance voltage-drop value as the open circuit voltage of the battery.

A calculation device includes:

a memory, configured to store program instructions;

a processor, configured to invoke the program instructions stored in the memory, to perform the following steps according to an obtained program: monitoring a voltage value and a current value of an output end of a battery; determining a battery impedance value based on the voltage value; calculating an impedance voltage-drop value based on the current value and the battery impedance value; calculating an open circuit voltage of the battery based on the voltage value and the impedance voltage-drop value; and when a difference of the open circuit voltage between two consecutive calculations is determined to be greater than or equal to a threshold, judging that the battery state is abnormal.

A computer storage medium is provided. The computer readable storage medium stores computer executable instructions, and the computer executable instructions are configured to enable the computer to perform any method described above.

Beneficial effects of the present disclosure are as follows:

To sum up, in the embodiments of the present disclosure, during a process of performing battery state monitoring, an impedance voltage-drop value is calculated based on the current value and the battery impedance value; an open circuit voltage of the battery is calculated based on the voltage value and the impedance voltage-drop value; and when a difference of the open circuit voltage between two consecutive calculations is determined to be greater than or equal to a threshold, it is judged that the battery state is abnormal.

By using the foregoing method, after the voltage value and the current value of the output end of the battery are monitored, the battery impedance value corresponding to the voltage value is determined, an impedance voltage-drop value of the battery impedance is calculated based on the battery impedance value and the current value, and the open circuit voltage of the battery is calculated based on the impedance voltage-drop value and the voltage value. Further, the battery state is judged by verifying a relationship between a set threshold and a difference of the open circuit voltage between two consecutive calculations, thereby improving the accuracy of battery safety judgment. A possibility of a battery safety accident occurring can be predicted, thereby reducing or avoiding a risk of fire outbreak of a device caused due to a battery safety fault of the device.

DETAILED DESCRIPTION

To resolve a problem existing in the prior art that a result of a battery safety judgment is not accurate, the battery state cannot be monitored in real time, and consequently fire outbreak of a device caused due to a battery safety accident of the device cannot be reduced or avoided, embodiments of the present disclosure provide an innovative battery state monitoring method and apparatus. The method is: calculating an impedance voltage-drop value based on the current value and the battery impedance value; calculating an open circuit voltage of the battery based on the voltage value and the impedance voltage-drop value; and judging that the battery state is abnormal when a difference of the open circuit voltage between two consecutive calculations is determined to be greater than or equal to a threshold.

The technical solutions in the embodiments of the present disclosure were clearly and completely described below with reference to the accompanying drawings herein. Apparently, the described embodiments are merely partial but not all of the embodiments of the present disclosure. All other embodiments obtained by persons skilled in the art based on the embodiments of the present disclosure without creative efforts shall fall within the protection scope of the present disclosure.

Figure 1:
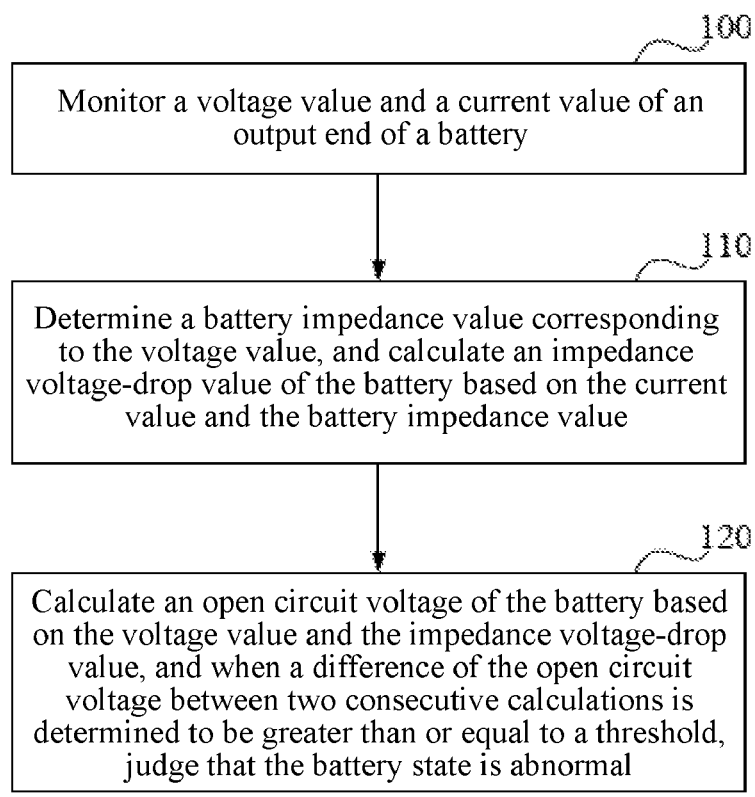
FIG. 1 is a detailed flowchart of a battery state monitoring method according to an embodiment of the present disclosure.

Referring to FIG. 1, in an embodiment of the present disclosure, a detailed process of a battery state monitoring method is as follows:

Step 100: Monitor a voltage value and a current value of an output end of a battery.

Specifically, before step 100 is performed, based on a minimum voltage value and a maximum voltage value of the output end of the battery, several voltage nodes are preset, where the voltage nodes include the minimum voltage value and the maximum voltage value; and based on the several voltage nodes, several voltage ranges are obtained through partitioning between the minimum voltage value and the maximum voltage value, where two neighboring voltage nodes form a voltage range.

In practical application, a normal charging/discharging voltage of a lithium-ion battery cannot be less than a preset minimum voltage value (for example, 3.4 V) of an output end of the battery, and the normal charging/discharging voltage of the lithium-ion battery cannot be greater than a preset maximum voltage value (for example, from 4.2 V to 4.45 V) of the output end of the battery. Therefore, in this embodiment of the present disclosure, when the lithium-ion battery is produced and/or assembled, based on the preset minimum voltage value and maximum voltage value of the output end of the lithium-ion battery, several voltage nodes (that is, voltage values) including the minimum voltage value and the maximum voltage value of the output end of the battery are set. Optionally, the preset minimum voltage value of the output end of the battery may be set to a first voltage node Vmix, a second voltage node V1, a third voltage node V2, . . . , an $(n+1)^{th}$ voltage node Vn, and so on are set, and the preset maximum voltage value of the output end of the battery may be set to a last voltage node Vmax.

In embodiments of the present disclosure, a preferable implementation is to set 13 voltage nodes, that is, $V_{min}$, $V_1$, $V_2$, . . . , $V_{10}$, $V_{11}$, and $V_{max}$. In this way, 12 voltage ranges such as [$V_{min}$, $V_1$), [$V_1$, $V_2$), . . . , [$V_{10}$, $V_{11}$), and [$V_{11}$, $V_{max}$] may be obtained through partitioning between the minimum voltage value and the maximum voltage value of the output end of the battery based on the selected 13 voltage nodes.

Certainly, in embodiments of the present disclosure, a voltage node selection manner includes, but is not limited to, any one of the following manners:

A first manner is: voltage nodes are selected in an equal voltage difference manner, that is, a difference between any two neighboring voltage nodes is constant.

For example, assuming that the preset minimum voltage value of the output end for the lithium-ion battery is 3.4 V, and the preset maximum voltage value of the output end for the lithium-ion battery is 4.2 V, voltage nodes may be set to: 3.4 V, 3.6 V, 3.8 V, 4.0 V, and 4.2 V based on the minimum voltage value (3.4 V) and the maximum voltage value (4.2 V). Obviously, a difference between any two neighboring voltage nodes is 0.2 V.

A second manner is: voltage nodes are selected based on a trend of a change in a battery impedance at different voltages of the output end of the battery, that is, if a change in a battery impedance within a voltage range is relatively large, a difference between two neighboring voltage nodes is set to a relatively small value within the voltage range; or if a change in a battery impedance within a voltage range is relatively small, a difference between two neighboring voltage nodes is set to a relatively large value within the voltage range.

For example, assuming that the preset minimum voltage value of the output end for the lithium-ion battery is 3.4 V, and the preset maximum voltage value of the output end for the lithium-ion battery is 4.2 V, a change in a battery impedance of the lithium-ion battery is relatively large between 3.4 V and 3.8 V, and a change in a battery impedance of the lithium-ion battery is relatively small between 3.8 V and 4.2 V, voltage nodes may be set to: 3.4 V, 3.5 V, 3.6 V, 3.7 V, 3.8 V, 4.0 V, and 4.2 V.

In embodiments of the present disclosure, for a voltage node selection manner, a corresponding selection manner may be selected based on different application scenarios and/or different requirements of different users. This is not specifically limited in this embodiment of the present disclosure.

Specifically, in embodiments of the present disclosure, when step 100 is performed, the voltage value and the current value of the output end of the battery are monitored at a preset frequency in real time. In embodiments of the present disclosure, a preferable implementation is to set a monitoring time interval to 250 milliseconds (ms), that is, 4 times/minute (min).

Step 110: Determine a battery impedance value corresponding to the voltage value, and calculate an impedance voltage-drop value of the battery based on the current value and the battery impedance value.

Specifically, in embodiments of the present disclosure, when step 110 is performed, a voltage range within which the voltage value falls is determined based on the monitored voltage value, and one voltage node of two neighboring voltage nodes forming the voltage range with a relative smaller difference to the voltage value is used as a voltage node corresponding to the voltage value; and a battery impedance value corresponding to the voltage node is obtained from a list that is of a correspondence between a voltage node and a battery impedance value updated in the last monitoring period, and a product of the battery impedance value corresponding to the voltage node and the current value of the output end of the battery is used as the impedance voltage-drop value of the battery.

In practical application, after a voltage value and a current value of an output end of a battery are monitored, a battery impedance corresponding to the voltage value of the output end of the battery needs to be determined, and then an impedance voltage-drop value caused by the battery impedance is calculated based on the determined battery impedance and the monitored current value of the output end of the battery.

In embodiments of the present disclosure, a list that is of a correspondence between a voltage node and a battery impedance value and that is used to represent a mapping relationship between a voltage node and a corresponding battery impedance value is maintained. Therefore, after a voltage value of an output end of a battery is monitored, a voltage node corresponding to the voltage value needs to be determined, and then a battery impedance value corresponding to the voltage value is determined based on the voltage node and the list that is of a correspondence between a voltage node and a battery impedance value updated in the last monitoring period.

Certainly, in embodiments of the present disclosure, after a voltage value of an output end of a battery is monitored, a manner, in which a voltage range within which the voltage value falls is determined and one voltage node of two neighboring voltage nodes forming the voltage range with a relative smaller difference to the voltage value is used as a voltage node corresponding to the voltage value, may further include any one of the following manners:

For example, assuming that a monitored voltage value of an output end of a battery is U1, and a voltage range within which the voltage value falls is $[V_n, V_{n+1})$, for example, $V_n<U1<V_{n+1}$, and a difference between $V_n$ and U1 is less than a difference between U1 and $V_{n+1}$, $V_n$ may be determined as a voltage node corresponding to U1.

For another example, assuming that a monitored voltage value of an output end of a battery is U2, and a voltage range within which the voltage value falls is $[V_n, V_{n+1})$, for example, $V_n<U2<V_{n+1}$, $V_n$ may be directly determined as a voltage node corresponding to U2.

For another example, assuming that a monitored voltage value of an output end of a battery is U3, and a voltage range within which the voltage value falls is $[V_n, V_{n+1})$, for example, $V_n<U3<V_{n+1}$, $V_{n+1}$ may be directly determined as a voltage node corresponding to U3.

Further, in embodiments of the present disclosure, several voltage nodes are set at an initial stage (that is, when a battery is produced and/or assembled). Based on a large quantity of experimental results, a corresponding initial battery impedance value is set for each set voltage node. In a first monitoring period, a list that is of a correspondence between a voltage node and a battery impedance value updated in the last monitoring period does not exist. Therefore, optionally, a corresponding battery impedance value may be calculated by using a preset initial battery impedance value.

In embodiments of the present disclosure, in each monitoring period, the maintained list of a correspondence between a voltage node and a battery impedance value needs to be updated. That is, in a current monitoring period, if a battery impedance value corresponding to any voltage node is calculated, a battery impedance value that corresponds to the any voltage node and that is in the list of a correspondence between a voltage node and a battery impedance value is updated to the current calculated battery impedance value. Specifically, a manner of updating the list of a correspondence between a voltage node and a battery impedance value is:

Within the current monitoring period, when the voltage value of the output end of the battery is determined to be equal to any voltage node, the voltage value and the current value of the output end of the battery are monitored at a preset frequency; a difference between two neighboring monitored voltage values of the output end of the battery is divided by a difference between two neighboring monitored current values of the output end of the battery, to obtain a corresponding real-time battery impedance value; and real-time battery impedance values are continuously calculated N times, and an average value of the N times' real-time battery impedance values is updated to a battery impedance value that corresponds to the any voltage node and that is in the list of a correspondence between a voltage node and a battery impedance value.

For example, it is assumed that when a voltage value of the output end of the battery is equal to a voltage node Vn, voltage values of the output end of the battery that are monitored based on a preset monitoring period are U1, U2, . . . , Um, Um+1, and so on, and current values corresponding to the voltage values are I1, I2, . . . , Im, Im+1, and so on. Then, a quotient obtained by dividing a difference between U1 and U2 by a difference between I1 and I2 may be used as a first real-time battery internal-resistance value R1, a quotient obtained by dividing a difference between U2 and U3 by a difference between I2 and I3 may be used as a second real-time battery internal-resistance value R2, . . . , a quotient obtained by dividing a difference between Um and Um+1 by a difference between Im and Im+1 may be used as an $m^{th}$ real-time battery internal-resistance value Rm, an average value R of R1, R2, . . . , and Rm is calculated, where R=(R1+R2+ . . . +Rm)/m, and R is updated to a battery impedance value that corresponds to the voltage node Vn and that is in the list of a correspondence between a voltage node and a battery impedance value.

Step 120: Calculate an open circuit voltage of the battery based on the voltage value and the impedance voltage-drop value, and when a difference of the open circuit voltage between two consecutive calculations is determined to be greater than or equal to a threshold, judge that the battery state is abnormal.

In practical application, a measured voltage value of an output end of a battery is less than an actual voltage of the battery, that is, an open circuit voltage (OCV), and the open circuit voltage is a terminal voltage of the battery in an open circuit state. Then, in an operating process of the battery, because the battery has a battery impedance value, a corresponding impedance voltage-drop value is generated, and the open circuit voltage of the battery is equal to a sum of the measured voltage value of the output end of the battery and the impedance voltage-drop value.

Specifically, in embodiments of the present disclosure, when step 120 is performed, a sum of the voltage value and the impedance voltage-drop value is used as the open circuit voltage of the battery; and a difference between two neighboring times' calculated open circuit voltages is calculated, and when a difference of the open circuit voltage between two consecutive calculations is determined to be greater than or equal to a set threshold, it is determined that the battery is in a short-circuited state.

In practical application, if it is verified that a difference of the open circuit voltage between two consecutive calculations is greater than or equal to the set threshold, it indicates that a short-circuited fault may occur in the battery. In this case, a circuit of the battery needs to be switched off, and a user is informed by using an alarm.

Further, if it is verified that a difference of the open circuit voltage between two consecutive calculations is less than the set threshold, it is determined that the battery is in a safe state, and the battery state continues to be monitored.

In embodiments of the present disclosure, the set threshold may be correspondingly set based on precision of a test device and/or a model of the battery. This is not specifically limited in embodiments of the present disclosure.

Figure 2:
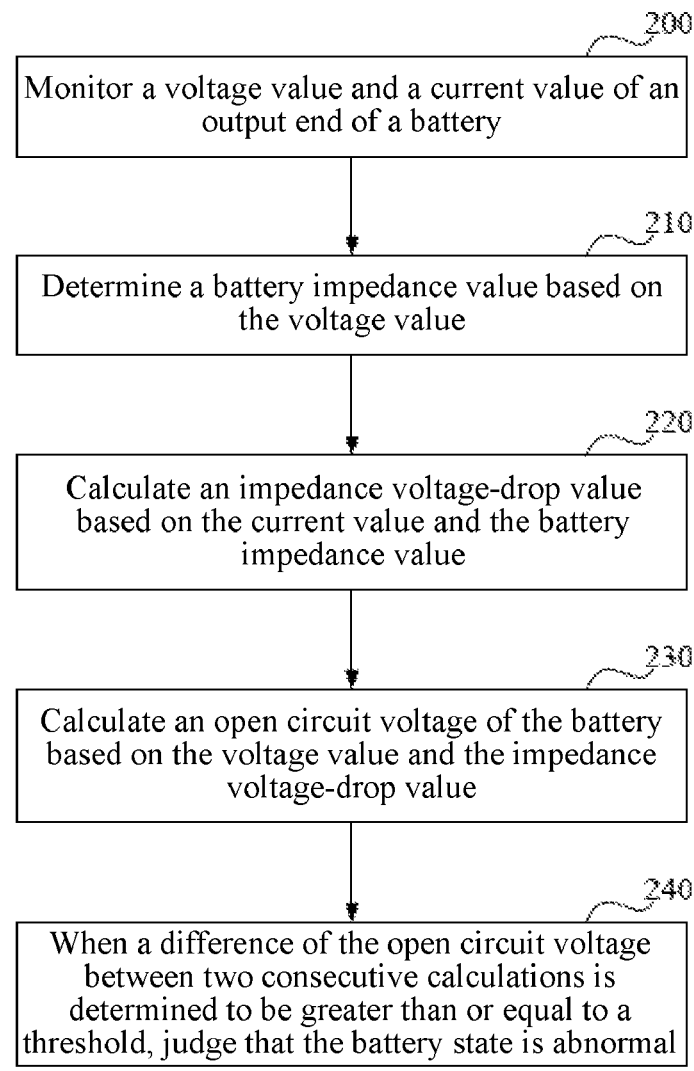
FIG. 2 is a detailed flowchart of another battery state monitoring method according to an embodiment of the present disclosure.

Referring to FIG. 2, in embodiments of the present disclosure, a detailed process of another battery state monitoring method is as follows:

Step 200: Monitor a voltage value and a current value of an output end of a battery.

Step 210: Determine a battery impedance value based on the voltage value.

Step 220: Calculate an impedance voltage-drop value based on the current value and the battery impedance value.

Step 230: Calculate an open circuit voltage of the battery based on the voltage value and the impedance voltage-drop value.

Step 240: When a difference of the open circuit voltage between two consecutive calculations is determined to be greater than or equal to a threshold, judge that the battery state is abnormal.

Figure 3:
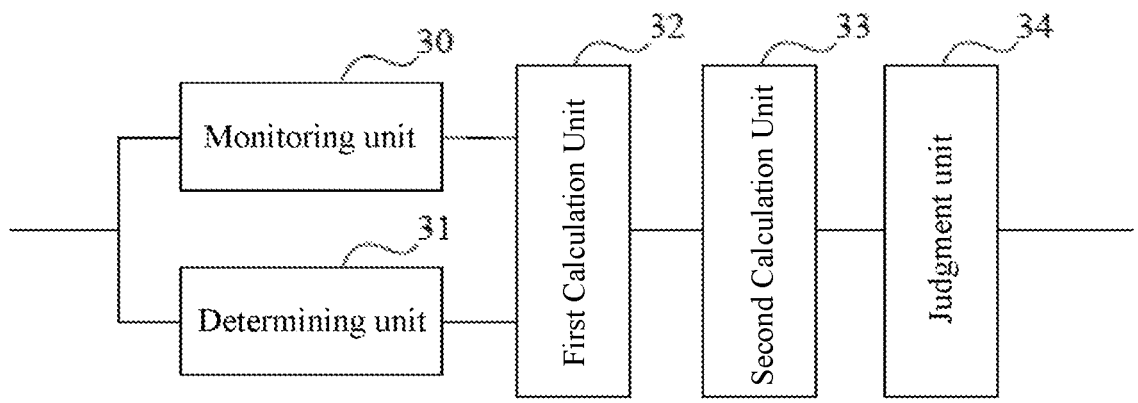
FIG. 3 is a schematic structural diagram of a battery state monitoring apparatus according to an embodiment of the present disclosure.

Based on the foregoing embodiments, referring to FIG. 3, in an embodiment of the present disclosure, a battery state monitoring apparatus includes at least a monitoring unit 30, a determining unit 31, a first calculation unit 32, a second calculation unit 33, and a judgment unit 34, where:

the monitoring unit 30 is configured to monitor a voltage value and a current value of an output end of a battery;

the determining unit 31 is configured to determine a corresponding battery impedance value based on the voltage value;

the first calculation unit 32 is configured to calculate an impedance voltage-drop value based on the current value and the battery impedance value;

the second calculation unit 33 is configured to calculate an open circuit voltage of the battery based on the voltage value and the impedance voltage-drop value; and the judgment unit 34 is configured to judge that the battery state is abnormal when a difference of the open circuit voltage between two consecutive calculations is determined to be greater than or equal to a threshold.

Preferably, the apparatus further includes:

a setting unit, configured to preset a plurality of voltage nodes based on a minimum voltage value and a maximum voltage value of the output end of the battery, where the voltage nodes include the minimum voltage value and the maximum voltage value; and obtain at least one voltage range through partitioning between the minimum voltage value and maximum voltage value, where two neighboring voltage nodes form the at least one voltage range.

Preferably, when the corresponding battery impedance value is determined based on the voltage value, and the impedance voltage-drop value is calculated based on the current value and the battery impedance value, the determining unit 31 is specifically configured to: determine a voltage range within which the voltage value falls, and use one voltage node of two neighboring voltage nodes with a smaller difference to the voltage value as a first voltage node corresponding to the voltage value; and the first calculation unit 32 is specifically configured to: obtain a battery impedance value corresponding to the first voltage node from a list that is of a correspondence between a voltage node and a battery impedance value updated in the last monitoring period, and use a product of the battery impedance value corresponding to the first voltage node and the current value of the output end of the battery as the impedance voltage-drop value.

Preferably, a manner of updating the list of a correspondence between a voltage node and a battery impedance value is:

within a monitoring period, when the voltage value of the output end of the battery is determined to be equal to any voltage node, monitoring the voltage value and the current value of the output end of the battery at a preset frequency;

dividing a difference of the voltage value between two consecutive calculations by a difference of the current value between the two consecutive calculations to obtain a real-time battery impedance value; and continuously calculating battery impedance values N times, and updating an average value of the battery impedance values to a battery impedance value that corresponds to the any voltage node and that is in the list of a correspondence between a voltage node and a battery impedance value.

Preferably, when the open circuit voltage of the battery is calculated based on the voltage value and the impedance voltage-drop value, the second calculation unit 33 is specifically configured to:

use a sum of the voltage value and the impedance voltage-drop value as the open circuit voltage of the battery.

To sum up, in the embodiments of the present disclosure, in a process of performing battery state monitoring, an impedance voltage-drop value is calculated based on the current value and the battery impedance value; an open circuit voltage of the battery is calculated based on the voltage value and the impedance voltage-drop value; and when a difference of the open circuit voltage between two consecutive calculations is determined to be greater than or equal to a threshold, it is judged that the battery state is abnormal.

By using the foregoing method, after a voltage value and a current value of an output end of a battery are monitored, a battery impedance value corresponding to the voltage value is determined, an impedance voltage-drop value of a battery impedance is calculated based on the battery impedance value and the current value, and an open circuit voltage of the battery is calculated based on the impedance voltage-drop value and the voltage value. Further, the battery state is judged by verifying a relationship between a set threshold and a difference between two neighboring times' calculated open circuit voltages, thereby improving the accuracy of battery safety judgment. A possibility of a battery safety accident occurring can be predicted, thereby reducing or avoiding a risk of fire outbreak of a device caused due to a battery safety fault of the device.

A person skilled in the art should understand that, the embodiments of the present disclosure may be provided as a method, a system, or a computer program product. Therefore, the present disclosure may be in a form of complete hardware embodiments, complete software embodiments, or embodiments combining software and hardware. Moreover, the present disclosure may be in a form of a computer program product implemented on one or more computer usable storage mediums (which include but are not limited to a magnetic disk memory, a CD-ROM, an optical memory and the like) including computer usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the other programmable devices provide steps for implementing a specific function in one or more processes in the flowcharts and/or in one or more blocks in the block diagrams.

Although some preferred embodiments of the present disclosure have been described, persons skilled in the art can make changes and modifications to these embodiments once they learn the basic inventive concept. Therefore, the following claims are intended to be construed as to cover the exemplary embodiments and all changes and modifications falling within the scope of the present disclosure.

Obviously, a person skilled in the art can make various modifications and variations to the embodiments of the present disclosure without departing from the spirit and scope of the embodiments of the present disclosure. The embodiments of the present disclosure are intended to cover these modifications and variations provided that they fall within the scope of protection defined by the following claims and their equivalent technologies.

What is claimed is:

1. A battery state monitoring method, comprising the steps of:
    monitoring a voltage value and a current value of an output end of a battery, presetting a plurality of voltage nodes based on a minimum voltage value and a maximum voltage value of the output end of the battery, wherein the plurality of voltage nodes comprises the minimum voltage value and the maximum voltage value, and obtaining at least one voltage range through partitioning between the minimum voltage value and the maximum voltage value, wherein two neighboring voltage nodes form the at least one voltage range;
    determining a voltage range within which the voltage value falls, and using one voltage node of two neighboring voltage nodes with a smaller difference to the voltage value as a first voltage node corresponding to the voltage value, and obtaining the battery impedance value corresponding to the first voltage node from a list that is of a correspondence between a voltage node and a battery impedance value updated in a last monitoring period, wherein voltage nodes in the list updated in a last monitoring period are determined based on a trend of a change in battery impedance values;
    calculating an impedance voltage-drop value based on the current value and the battery impedance value;
    calculating an open circuit voltage of the battery based on the voltage value and the impedance voltage-drop value;
    when a difference of the open circuit voltage between two consecutive calculations is determined to be greater than or equal to a threshold, judging that the battery state is abnormal; and
    when the difference of the open circuit voltage between two consecutive calculations is determined to be lower than the threshold, updating the battery impedance value based on the voltage value and the current value.

2. The method according to claim 1, wherein
    if a change in battery impedance values within a voltage range is larger than a first threshold, a difference between two neighboring voltage nodes is set to a first difference value within the voltage range,
    if the change in battery impedance values within the voltage range is smaller than a second threshold, the difference between two neighboring voltage nodes is set to a second difference value within the voltage range, and
    wherein the first threshold is larger than the second threshold, and the first difference value is smaller than the second difference value.

3. The method according to claim 1, wherein the steps of calculating an impedance voltage-drop value based on the current value and the battery impedance value comprise:
    using a product of the battery impedance value corresponding to the first voltage node and the current value of the output end of the battery as the impedance voltage-drop value.

4. The method according to claim 3, wherein a manner of updating the list that is of a correspondence between a voltage node and a battery impedance value is:
    within a monitoring period, when the voltage value of the output end of the battery is determined to be equal to any voltage node, monitoring the voltage value and the current value of the output end of the battery at a preset frequency;
    dividing a difference of the voltage value between two consecutive calculations by a difference of the current value between the two consecutive calculations to obtain a real-time battery impedance value; and
    continuously calculating the battery impedance values at least two times, and updating an average value of the battery impedance values to the battery impedance value that corresponds to the any voltage node and that is in the list that is of a correspondence between a voltage node and a battery impedance value.

5. The method according to claim 1, wherein the step of calculating an open circuit voltage of the battery based on the voltage value and the impedance voltage-drop value comprises:
    using a sum of the voltage value and the impedance voltage-drop value as the open circuit voltage of the battery.

6. A battery state monitoring apparatus, comprising:
    a memory, configured to store program instructions; and
    a processor, configured to invoke the program instructions stored in the memory, to perform the steps of:
    monitoring a voltage value and a current value of an output end of a battery, presetting a plurality of voltage nodes based on a minimum voltage value and a maximum voltage value of the output end of the battery, wherein the plurality of voltage nodes comprises the minimum voltage value and the maximum voltage value, and obtaining at least one voltage range through partitioning between the minimum voltage value and the maximum voltage value, wherein two neighboring voltage nodes form the at least one voltage range;
    determining a voltage range within which the voltage value falls, and using one voltage node of two neighboring voltage nodes with a smaller difference to the voltage value as a first voltage node corresponding to the voltage value, and obtaining the battery impedance value corresponding to the first voltage node from a list of a correspondence between a voltage node and a battery impedance value updated in a last monitoring period, wherein voltage nodes in the list updated in the last monitoring period are determined based on a trend of a change in battery impedance values;

calculating an impedance voltage-drop value based on the current value and the battery impedance value;

calculating an open circuit voltage of the battery based on the voltage value and the impedance voltage-drop value; and judging that the battery state is abnormal when a difference of the open circuit voltage between two consecutive calculations is determined to be greater than or equal to a threshold.

7. The apparatus according to claim 6, further comprising:

a setting processor, configured to preset a plurality of voltage nodes based on a minimum voltage value and a maximum voltage value of the output end of the battery, wherein the voltage nodes comprise the minimum voltage value and the maximum voltage value; and obtain at least one voltage range through partitioning between the minimum voltage value and the maximum voltage value, wherein two neighboring voltage nodes form the at least one voltage range, wherein if a change in battery impedance values within a voltage range is larger than a first threshold, a difference between two neighboring voltage nodes is set to a first difference value within the voltage range, and if the change in battery impedance values within the voltage range is smaller than a second threshold, the difference between two neighboring voltage nodes is set to a second difference value within the voltage range, and wherein the first threshold is larger than the second threshold, and the first difference value is smaller than the second difference value.

8. The apparatus according to claim 6, wherein the steps of calculating an impedance voltage-drop value is calculated based on the current value and the battery impedance value, comprises:

using a product of the battery impedance value corresponding to the first voltage node and the current value of the output end of the battery as the impedance voltage-drop value.

9. The apparatus according to claim 8, wherein a manner of updating the list that is of a correspondence between a voltage node and a battery impedance value is:

within a monitoring period, when the voltage value of the output end of the battery is determined to be equal to any voltage node, monitoring the voltage value and the current value of the output end of the battery at a preset frequency;

dividing a difference of the voltage value between two consecutive calculations by a difference of the current value between the two consecutive calculations to obtain a real-time battery impedance value; and continuously calculating the battery impedance values at least two times, and updating an average value of the battery impedance values to the battery impedance value that corresponds to the any voltage node and that is in the list that is of a correspondence between a voltage node and a battery impedance value.

10. The apparatus according to claim 6, wherein the steps of calculating an open circuit voltage of the battery based on the voltage value and the impedance voltage-drop value comprises:

using a sum of the voltage value and the impedance voltage-drop value as the open circuit voltage of the battery.

11. A computer storage medium, wherein the computer storage medium stores computer executable instructions, and the computer executable instructions are configured to enable a computer to perform the method according to claim 1.

* * * * *